(12) United States Patent
Seri et al.

(10) Patent No.: US 9,482,946 B2
(45) Date of Patent: Nov. 1, 2016

(54) PHOTOSENSITIVE RESIN COMPOSITION, PHOTOSENSITIVE ELEMENT USING SAME, METHOD FOR FORMING PARTITION WALL OF IMAGE DISPLAY DEVICE, AND METHOD FOR MANUFACTURING IMAGE DISPLAY DEVICE

(75) Inventors: Yasuhiro Seri, Hitachi (JP); Mayumi Sato, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 138 days.

(21) Appl. No.: 14/008,503

(22) PCT Filed: Mar. 20, 2012

(86) PCT No.: PCT/JP2012/057364
§ 371 (c)(1),
(2), (4) Date: Dec. 9, 2013

(87) PCT Pub. No.: WO2012/133116
PCT Pub. Date: Oct. 4, 2012

(65) Prior Publication Data
US 2014/0087619 A1   Mar. 27, 2014

(30) Foreign Application Priority Data
Mar. 30, 2011   (JP) ............................. P2011-074948

(51) Int. Cl.
*G03F 7/038*   (2006.01)
*G03F 7/027*   (2006.01)
(Continued)

(52) U.S. Cl.
CPC ........... *G03F 7/0382* (2013.01); *G03F 7/0048* (2013.01); *G03F 7/027* (2013.01); *G03F 7/033* (2013.01); *G03F 7/105* (2013.01); *G03F 7/20* (2013.01)

(58) Field of Classification Search
CPC ...... G03F 7/004; G03F 7/033; G03F 7/0048; G03F 7/027; G03F 7/0382; G03F 7/105; G03F 7/20
See application file for complete search history.

(56) References Cited

U.S. PATENT DOCUMENTS

2005/0288166 A1\* 12/2005 Cha et al. ........................ 501/17
2007/0021563 A1\*  1/2007 Kasai et al. ................... 525/191
(Continued)

FOREIGN PATENT DOCUMENTS

CN      101681097 A    3/2010
JP      2007-072035 A  3/2007
(Continued)

OTHER PUBLICATIONS

Office Action issued in counterpart Japanese application P2013-507465 on May 27, 2014 (no translation available; submitted for certification).
(Continued)

*Primary Examiner* — Joseph L Williams
*Assistant Examiner* — Jacob R Stern
(74) *Attorney, Agent, or Firm* — Griffin and Szipl PC

(57) ABSTRACT

The present invention provides a photosensitive resin composition which can form an excellently light-resistant partition wall of an image display device and has excellent patterning properties. One embodiment of the present invention is a photosensitive resin composition for forming a partition wall of an image display device, comprising: (A) a binder polymer; (B) a photopolymerizable compound; (C) a photopolymerization initiator; (D) an inorganic black pigment; (E) a surfactant; and (F) a mercapto group-containing compound, wherein the (B) photopolymerizable compound contains a photopolymerizable compound having at least one unsaturated group and an isocyanuric ring structure in a molecule.

19 Claims, 2 Drawing Sheets

(51) Int. Cl.
*G03F 7/033* (2006.01)
*G03F 7/105* (2006.01)
*G03F 7/20* (2006.01)
*G03F 7/004* (2006.01)

(56) References Cited

U.S. PATENT DOCUMENTS

| | | | |
|---|---|---|---|
| 2010/0072889 A1 | 3/2010 | Takahashi et al. | |
| 2010/0167188 A1* | 7/2010 | Lee | G03F 7/0007 430/7 |
| 2011/0003279 A1* | 1/2011 | Patel | 435/5 |

FOREIGN PATENT DOCUMENTS

| | | |
|---|---|---|
| JP | 2007-178881 A | 7/2007 |
| JP | 2007-249190 A | 9/2007 |
| JP | 2009-122650 A | 6/2009 |
| JP | 2009-265518 A | 11/2009 |
| JP | 2010-066676 A | 3/2010 |
| JP | 2010-169934 A | 8/2010 |
| JP | 2010-237567 A | 10/2010 |
| JP | 2010-256775 A | 11/2010 |
| JP | 2010-266861 A | 11/2010 |
| KR | 10-2010-0016089 A | 2/2010 |
| WO | 2008/146855 A1 | 12/2008 |
| WO | 2010/134550 A1 | 11/2010 |

OTHER PUBLICATIONS

Office action issued in corresponding Korean application 10-2013-7027775 on Aug. 13, 2015 (no translation available; submitted for certification).

Office action issued in corresponding Chinese application 201280015892.1 on Sep. 25, 2015 (no translation available; submitted for certification).

International Search Report issued in corresponding application PCT/JP2012/057364, completed Apr. 12, 2012 and mailed Apr. 24, 2012.

Itsuo Tanuma, "Flexible Electronic Paper using Electronic Liquid Powder Technology," The Imaging Society of Japan, vol. 46, No. 5, 2007, pp. 396-400.

Akira Suzuki, "Latest Trend 2007 for E-Paper," The Imaging Society of Japan, vol. 46, No. 5, 2007, pp. 372-384.

International Preliminary Report on Patentability issued in corresponding application PCT/JP2012/057364, issued Oct. 8, 2013 and mailed Oct. 17, 2013.

* cited by examiner (a)

(b)

(c)

(d)

(e)

PHOTOSENSITIVE RESIN COMPOSITION, PHOTOSENSITIVE ELEMENT USING SAME, METHOD FOR FORMING PARTITION WALL OF IMAGE DISPLAY DEVICE, AND METHOD FOR MANUFACTURING IMAGE DISPLAY DEVICE

This is a National Phase Application in the United States of International Patent Application No. PCT/JP2012/057364 filed Mar. 22, 2012, which claims priority on Japanese Patent Application No. P2011-074948, filed Mar. 30, 2011. The entire disclosures of the above patent applications are hereby incorporated by reference.

TECHNICAL FIELD

The present invention relates to a photosensitive resin composition, a photosensitive element using the photosensitive resin composition, a method for forming a partition wall of an image display device, and a method for manufacturing an image display device.

BACKGROUND ART

In recent years, image display devices (PLD: Paper-Like Display) which are thin like paper, convenient to carry, and capable of displaying letters and images have attracted attention. Since such image display devices have visibility and portability, that are advantages of paper as normal printed matter, and are electrically rewritable information, there have been attempts to put the image display devices into practical use as an alternative to paper in view of environment aspect and cost aspect.

Various types such as a type for moving particles by electrophoresis or the like, a liquid crystal type, and an electrochemical type are devised as display techniques of image display devices (for example, see Non-Patent Literature 1).

Particularly, a microcapsule electrophoresis type, a microcup electrophoresis type, an electronic liquid powder type, a toner display type, and the like are considered as the type for moving particles. In the cases of these types, black and white particles, which are display mediums, are enclosed between transparent electrodes and an electric field is applied to electrically move the particles, thereby forming and displaying monochrome images. Active driving and passive driving are employed as a method for driving an image display device, and a back surface technique (panel circuit) for an image display device is also considered.

In the case of the image display device of the above-described particle movement type, a partition wall is required to enclose black and white particles as described above. As a method for forming such a partition wall, a mold transfer method, a screen printing method, a sandblast method, a photolithography method, and an additive method or the like is proposed (for example, see Patent Literature 1). Among them, a photolithography method which uses a photosensitive resin composition to efficiently form a high-definition pattern upon irradiation with active light rays is attracting attention.

In recent years, an example in which a full-color display is realized by combining a color filter with the monochrome image display has also been reported (for example, see Non Patent Literature 2).

In addition, despite differing from the above-described PLD, a display (laser drawing-type display) which displays an image by drawing and excitation of a fluorescent material with a semiconductor laser has attracted attention in recent years. Since this display has a simple structure, the manufacturing cost thereof is low, and since only a display pixel is drawn by the laser, the display has a characteristic in that it is excellent in terms of low power consumption. It is required for this display to have a partition wall since it is required to partition and enclose the fluorescent material. As a method for forming such a partition wall, there are various methods as in the case of the PLD, and among them, a photolithography method capable of efficiently forming a high-definition pattern is attracting attention.

A partition wall of an image display device using the photolithography method is formed as follows. That is, the partition wall of the image display device is formed through a method including the steps of: laminating a light-shielding layer, called a black matrix, on a substrate by a photolithography technique depending on the case; applying a photosensitive resin composition or laminating a photosensitive film (photosensitive element) on the light-shielding layer to form a photosensitive resin composition layer; irradiating a predetermined portion of the photosensitive resin composition layer with active light rays to photocure the exposed portion; and removing the unexposed portion to form a photocured pattern. Accordingly, it is generally required for a photosensitive resin composition for forming a partition wall of an image display device to have patterning properties (sensitivity, resolution, and adhesion to a substrate).

When an image display device for a PLD is manufactured, a step of filling the photocured pattern obtained in the above-described step with a display medium such as particles, a step of heat-treating the photocured pattern, a step of attaching an electrode substrate, and the like are further included. Accordingly, an image display device having a cured photosensitive resin composition layer as a partition wall is obtained. Since a high-temperature process is essential in the above-described steps, the partition wall of the image display device which is formed using the photosensitive resin composition is required to have heat resistance and the like.

In addition, when a laser drawing-type display is manufactured, a step of heat-treating the photocured pattern obtained in the above-described step or a step of coating the inside of the photocured pattern with a fluorescent material or the like is further included. Accordingly, a laser drawing-type display having a cured photosensitive resin composition layer as a partition wall is obtained.

Furthermore, a partition wall material is desired to have gray to black colors depending on the display or intended use. The reason for this is that when the partition wall has the above-described colors, it is possible to expect an effect in which sharp colors are shown upon display of images.

The following Patent Literatures 2 to 4 disclose a photosensitive resin composition for forming a partition wall of an image display device.

CITATION LIST

Patent Literature

[Patent Literature 1] Japanese Unexamined Patent Application Publication No. 2007-178881
[Patent Literature 2] Japanese Unexamined Patent Application Publication No. 2010-066676
[Patent Literature 3] Japanese Unexamined Patent Application Publication No. 2010-169934

[Patent Literature 4] Japanese Unexamined Patent Application Publication No. 2010-256775

Non Patent Literature

[Non-Patent Literature 1] Akira Suzuki, "2007 the latest trends in electronic paper" Oct. 10, 2007, Vol 46, No. 5, 372 to 384, Journal of Imaging Society of Japan (2007)

[Non-Patent Literature 2] Itsuo Tanuma, "flexible electronic paper using electronic liquid powder", Oct. 10, 2007, Vol. 46, No. 5, 396 to 400, Journal of Imaging Society of Japan (2007)

SUMMARY OF INVENTION

Technical Problem

When using a photosensitive resin composition for forming a partition wall of an image display device disclosed in the Patent Literatures 2 to 4, there is a problem in that in some cases, light resistance, that is one reliability required for the display, is not sufficient, and thus fading occurs from ultraviolet rays and display characteristics are affected. Particularly, in the case of a laser drawing-type display, a partition wall material is irradiated with an ultraviolet laser, and when the photosensitive resin composition disclosed in the Patent Literatures 2 to 4 is used, there is a problem in that fading occurs in the photosensitive resin composition and display characteristics are affected.

The invention is contrived to solve the problems, and an object of the invention is to provide a photosensitive resin composition which can form an excellently light-resistant partition wall of an image display device and has excellent patterning properties, a photosensitive element using the photosensitive resin composition, a method for forming a partition wall of an image display device, and a method for manufacturing an image display device.

Solution to Problem

The invention provides a photosensitive resin composition for forming a partition wall of an image display device, comprising: (A) a binder polymer; (B) a photopolymerizable compound; (C) a photopolymerization initiator; (D) an inorganic black pigment; (E) a surfactant; and (F) a mercapto group-containing compound, wherein the (B) photopolymerizable compound contains a photopolymerizable compound having at least one unsaturated group and an isocyanuric ring structure in a molecule.

Since the photosensitive resin composition of the invention has the above-described configuration, a partition wall for an image display device which has excellent patterning properties and has excellent light resistance so that fading does not occur from ultraviolet rays can be easily formed with good workability.

In the photosensitive resin composition of the invention, the photopolymerizable compound having at least one unsaturated group and an isocyanuric ring structure in a molecule preferably further contains at least one hydroxyl group in a molecule. Accordingly, light resistance and patterning properties can be further improved.

In the photosensitive resin composition of the invention, the (D) inorganic black pigment preferably includes black titanium oxide. Accordingly, light resistance and patterning properties can be balanced at a higher level.

In the photosensitive resin composition of the invention, the (E) surfactant preferably includes an imidazoline-based surfactant. Accordingly, the effect of the invention can be further improved.

The invention further provides a photosensitive element comprising: a support; and a photosensitive resin composition layer which is formed of the photosensitive resin composition formed on the support.

Since the photosensitive element of the invention is provided with the photosensitive resin composition layer formed of the photosensitive resin composition of the invention, a partition wall for an image display device which has excellent light resistance so that fading does not occur from ultraviolet rays with no damages in coating appearance can be easily formed with good workability.

In the photosensitive element of the invention, the photosensitive resin composition layer preferably has a thickness of 10 µm to 100 µm. Accordingly, a partition wall for an image display device which has excellent light resistance so that fading does not occur from ultraviolet rays with no damages in coating appearance can be more easily formed with good workability.

The invention further provides a method for forming a partition wall of an image display device, comprising: a lamination step of laminating a photosensitive resin composition layer which is formed of the photosensitive resin composition on a substrate of the image display device; an exposure step of irradiating a predetermined portion of the photosensitive resin composition layer with active light rays to photocure the exposed portion; and a developing step of removing a portion other than the exposed portion of the photosensitive resin composition layer to form a photocured pattern. In the case of manufacturing a laser drawing-type display, there is also provided a method for forming a partition wall of an image display device including a step of forming a photocured pattern in the same manner as in the above step.

Since the method for forming a partition wall of an image display device of the invention uses the photosensitive resin composition of the invention, a partition wall for an image display device which has excellent light resistance so that fading does not occur from ultraviolet rays can be easily formed with good workability.

The invention further provides a method for forming a partition wall of an image display device, further comprising: a heating step of thermally curing a photocured pattern formed by the method for forming a partition wall of an image display device by a heating treatment at 60° C. to 250° C.

The invention further provides a method for manufacturing an image display device, comprising: a step of filling or coating the inside of the partition wall with a display medium; and a step of attaching a substrate on the opposite side of the partition wall so as to be opposed to the other substrate.

The invention further provides a use of a composition, as a photosensitive resin composition for forming a partition wall of an image display device, comprising: (A) a binder polymer; (B) a photopolymerizable compound; (C) a photopolymerization initiator; (D) an inorganic black pigment; (E) a surfactant; and (F) a mercapto group-containing compound, wherein the (B) photopolymerizable compound contains a photopolymerizable compound having at least one unsaturated group and an isocyanuric ring structure in a molecule. The invention still further provides a use of a composition for manufacturing a photosensitive resin composition for forming a partition wall of an image display device, comprising: (A) a binder polymer; (B) a photopolymerizable compound; (C) a photopolymerization initiator; (D) an inorganic black pigment; (E) a surfactant; and (F) a mercapto group-containing compound, wherein the (B) photopolymerizable compound contains a photopolymerizable compound having at least one unsaturated group and an isocyanuric ring structure in a molecule.

Advantageous Effects of Invention

According to the invention, it is possible to provide a photosensitive resin composition which can form an excellently light-resistant partition wall of an image display device and has excellent patterning properties, a photosensitive element using the photosensitive resin composition, a method for forming a partition wall of an image display device, and a method for manufacturing an image display device. In addition, the photosensitive resin composition of the invention is excellent in dispersion stability of the (D) inorganic black pigment, and thus can maintain superior coating appearance when the photosensitive resin composition of the invention is used to form a photosensitive element. In addition, according to the invention, a partition wall for an image display device which has excellent light resistance so that fading does not occur from ultraviolet rays can be easily formed with good workability.

DESCRIPTION OF EMBODIMENTS

Figure 1:
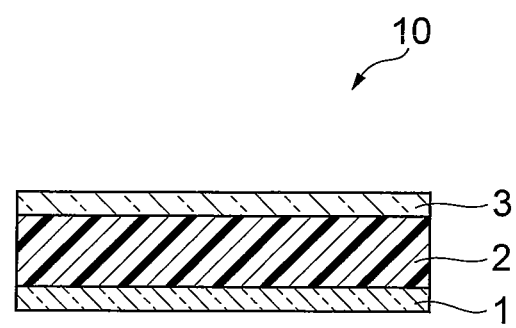
FIG. 1 is a schematic cross-sectional view showing a preferred embodiment of a photosensitive element of the invention.

Hereinafter, preferred embodiments of the invention will be described referring to the drawings depending on the case. In the drawings, the same or corresponding parts will be denoted by the same reference numerals, and overlapping descriptions will be omitted. The dimension ratios of the drawings are not limited to the ratios shown in the drawings. In this specification, (meth)acrylic acid means acrylic acid and methacrylic acid corresponding thereto. (Meth)acrylate means acrylate and methacrylate corresponding thereto. (Meth)acryloyl means acryloyl and methacryloyl corresponding thereto.

(Photosensitive Resin Composition)

A photosensitive resin composition of the invention contains (A) a binder polymer, (B) a photopolymerizable compound, (C) a photopolymerization initiator, (D) an inorganic black pigment, (E) a surfactant, and (F) a mercapto group-containing compound (mercapto group-containing hydrogen donor).

The mechanism of the effect due to the above-described configuration is not necessarily clear, but the inventors of the invention presume as follows. Hitherto, in order to improve patterning properties, leuco crystal violet has been used as a hydrogen donor of the (C) photopolymerization initiator. The leuco crystal violet becomes a crystal violet and forms a color after exposure, and thus colors a resin. However, a resin containing the above-described crystal violet has a problem in that fading from ultraviolet rays easily occurs. In contrast, the (F) mercapto group-containing compound (mercapto group-containing hydrogen donor) which is used in the invention can donate a hydrogen without forming a color, and thus patterning properties can be improved without causing a fading problem. In addition, in the invention, fading from ultraviolet rays can be reduced as much as possible by coloring the resin with the (D) inorganic black pigment.

Hereinafter, the respective components will be described in detail.

Component (A): Binder Polymer

Examples of the (A) binder polymer of the invention include acrylic-based resins, styrene-based resins, epoxy-based resins, amide-based resins, amide-epoxy-based resins, alkyd-based resins, and phenol-based resins. As the (A) binder polymer, acrylic-based resins are preferable from the viewpoint of alkali developability. These can be used alone, or in combination of two or more kinds. Examples of the combination of two or more kinds of binder polymers include two or more kinds of binder polymers composed of different copolymerization components, two or more kinds of binder polymers having different weight average molecular weights, and two or more kinds of binder polymers having different degrees of dispersion. It is also possible to use a polymer having a multi-mode molecular weight distribution described in Japanese Unexamined Patent Application Publication HEI No. 11-327137.

The binder polymer which is the component (A) can be manufactured by, for example, radical polymerization of a polymerizable monomer. Examples of the polymerizable monomer include polymerizable styrene derivatives such as styrene, vinyl toluene, α-methyl styrene, p-methyl styrene, and p-ethyl styrene, acrylamide, acrylonitrile, ethers of vinyl alcohol such as vinyl-n-butyl ether, (meth)acrylic acid esters such as (meth)acrylic acid alkyl ester, (meth)acrylic acid tetrahydrofurfuryl ester, (meth)acrylic acid dimethylaminoethyl ester, (meth)acrylic acid diethylaminoethyl ester, and (meth)acrylic acid glycidyl ester, 2,2,2-trifluoroethyl(meth)acrylate, 2,2,3,3-tetrafluoropropyl(meth)acrylate, (meth)acrylic acid, α-bromo(meth)acrylic acid, α-chloro(meth)acrylic acid, β-furyl(meth)acrylic acid, β-styryl(meth)acrylic acid, maleic acid, maleic anhydride, maleic acid monoesters such as monomethyl maleate, monoethyl maleate, and monoisopropyl maleate, fumaric acid, cinnamic acid, α-cyanocinnamic acid, itaconic acid, crotonic acid, and propiolic acid. These may be used alone as a homopolymer, or in combination of two or more kinds as a copolymer.

Examples of the (meth)acrylic acid alkyl ester include methyl (meth)acrylate, ethyl (meth)acrylate, propyl(meth)acrylate, butyl (meth)acrylate, pentyl(meth)acrylate, hexyl (meth)acrylate, heptyl(meth)acrylate, octyl(meth)acrylate, 2-ethylhexyl(meth)acrylate, and structural isomers thereof. These can be used alone, or in combination of two or more kinds.

The (A) binder polymer preferably contains a carboxyl group from the standpoint of alkali developability, and can be manufactured by, for example, radical polymerization of a polymerizable monomer having a carboxyl group and another polymerizable monomer. The polymerizable monomer having a carboxyl group is preferably a (meth)acrylic acid from the viewpoint of developability and stability.

The component (A) preferably has a constituent unit based on at least one kind of polymerizable monomer selected from the group consisting of butyl (meth)acrylate, butyl (meth)acrylate derivatives, styrene, and styrene derivatives, from the viewpoint of improving light resistance, resolution, and adhesion. In addition, the component (A) more preferably contains both of at least one kind selected from the group consisting of butyl (meth)acrylate and butyl (meth)acrylate derivatives and at least one kind selected from the group consisting of styrene and styrene derivatives. That is, the component (A) is preferably obtained by radical polymerization of these polymerizable monomers, and preferably has a constituent unit derived from these polymerizable monomers.

When the component (A) has a constituent unit based on butyl (meth)acrylate and a butyl (meth)acrylate derivative, the content thereof is preferably 1 mass % to 50 mass %, more preferably 5 mass % to 40 mass %, even more preferably 5 mass % to 35 mass %, and particularly preferably 10 mass % to 30 mass % based on the total mass of the polymerizable monomers constituting the component (A) in consideration of excellent adhesion and detachability.

When the component (A) has a constituent unit based on styrene or its derivative, the content thereof is preferably 10 mass % to 70 mass %, more preferably 15 mass % to 60 mass %, even more preferably 20 mass % to 50 mass %, and particularly preferably 25 mass % to 45 mass % based on the total mass of the polymerizable monomers constituting the component (A) in consideration of excellent adhesion and detachability.

In addition, the component (A) preferably has a constituent unit based on (meth)acrylic acid alkyl ester other than butyl (meth)acrylate and butyl (meth)acrylate derivatives, from the viewpoint of improving alkali developability and detachment characteristics.

When the component (A) has a constituent unit based on (meth)acrylic acid alkyl ester other than butyl (meth)acrylate and butyl (meth)acrylate derivatives, the content thereof is preferably 1 mass % to 50 mass %, more preferably 5 mass % to 45 mass %, even more preferably 10 mass % to 40 mass %, and particularly preferably 15 mass % to 40 mass % based on the total mass of the polymerizable monomers constituting the component (A) in consideration of excellent detachability, resolution, and adhesion.

The constituent unit based on (meth)acrylic acid alkyl ester preferably contains methyl (meth)acrylate or ethyl (meth)acrylate.

The acid value of the (A) binder polymer is preferably 30 mgKOH/g or greater, more preferably 80 mgKOH/g or greater, even more preferably 130 mgKOH/g or greater, and particularly preferably 180 mgKOH/g or greater from the viewpoint of resolution. In addition, the acid value of the (A) binder polymer is preferably 250 mgKOH/g or less, more preferably 240 mgKOH/g or less, even more preferably 230 mgKOH/g or less, and particularly preferably 220 mgKOH/g or less from the viewpoint of developer resistance and adhesion. When developing using a solvent is performed as a developing step, preparation is preferably performed with a suppressed amount of the polymerizable monomer having a carboxyl group.

The weight average molecular weight (measured by gel permeation chromatography (GPC) and converted according to a calibration curve using standard polystyrene) of the (A) binder polymer is preferably 20,000 or greater, more preferably 25,000 or greater, even more preferably 30,000 or greater, and particularly preferably 40,000 or greater from the viewpoint of developer resistance. In addition, the weight average molecular weight of the (A) binder polymer is preferably 300,000 or less, more preferably 150,000 or less, even more preferably 100,000 or less, and particularly preferably 90,000 or less from the viewpoint that the developing time can be reduced.

Component (B): Photopolymerizable Compound

The component (B) which can be used in this embodiment is not particularly limited as long as it is photocrosslinkable, and examples thereof include a component (B1): a photopolymerizable compound having at least one unsaturated group and an isocyanuric ring structure in a molecule, a component (B2): a compound which is obtained by reacting an α,β-unsaturated carboxylic acid with a polyhydric alcohol and/or a glycidyl group-containing compound, and a component (B3): a compound having one ethylenic unsaturated bond in a molecule. These can be used alone, or in combination of two or more kinds. Among them, the component (B1) is contained as an essential component in the photosensitive resin composition of the invention.

Component (B1): Photopolymerizable Compound Having at Least One Unsaturated Group and Isocyanuric Ring Structure in Molecule In the invention, the photopolymerizable compound which is the component (B1) can be used with no particular limits as long as it has at least one unsaturated group and an isocyanuric ring structure in a molecule. Furthermore, the photopolymerizable compound which is the component (B1) preferably has at least one hydroxyl group in a molecule.

The photopolymerizable compound which is the component (B) can include both of a photopolymerizable compound having at least one unsaturated group and an isocyanuric ring structure in a molecule and a photopolymerizable compound having at least one hydroxyl group, at least one unsaturated group, and an isocyanuric ring structure in a molecule.

As the photopolymerizable compound having at least one unsaturated group and an isocyanuric ring structure in a molecule, for example, a compound represented by Formula (I) is preferably used from the viewpoint of adhesion.

[Chemical Formula 1]

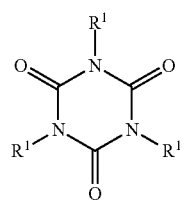

(I)

[In Formula (I), each $R^1$ independently represents a group represented by the following Formula (II), a group represented by the following Formula (III), or a group represented by the following Formula (IV). However, at least one $R^1$ is a group represented by the following Formula (II) or (IV).]

[Chemical Formula 2]

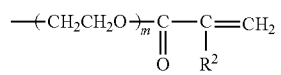

(II)

[In Formula (II), $R^2$ represents a hydrogen atom or a methyl group, and m represents an integer of 1 to 14.]

[Chemical Formula 3]

(III)

[In Formula (III), m represents an integer of 1 to 14.]

[Chemical Formula 4]

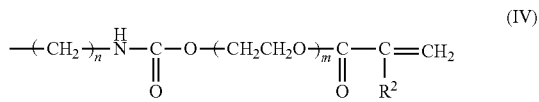

(IV)

[In Formula (IV), $R^2$ represents a hydrogen atom or a methyl group, n represents an integer of 1 to 9, and m represents an integer of 1 to 14.]

When the photopolymerizable compound has at least one hydroxyl group, at least one unsaturated group, and an isocyanuric ring structure in a molecule, at least one $R^1$ is a group represented by Formula (III), and at least one $R^1$ is a group represented by Formula (II) or (IV).

In Formula (II) or (III), m is an integer of 1 to 14, and preferably 1 to 6. When m is 14 or less, chemical resistance can be improved. In addition, in Formula (IV), m is an integer of 1 to 14, and preferably 1 to 6, and n is an integer of 1 to 9, and preferably 3 to 6. When m is 14 or less, chemical resistance can be improved, and when n is 9 or less, a mechanical strength can be improved.

The photopolymerizable compound having at least one unsaturated group and an isocyanuric ring structure in a molecule is particularly preferably a compound represented by Formula (V).

[Chemical Formula 5]

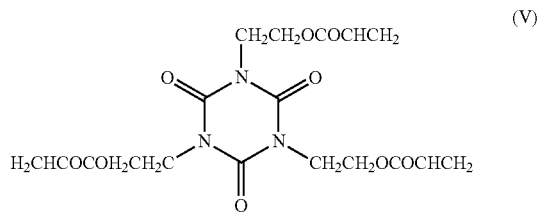

(V)

The photopolymerizable compound having at least one hydroxyl group, at least one unsaturated group, and an isocyanuric ring structure in a molecule is particularly preferably a compound represented by Formula (VI).

[Chemical Formula 6]

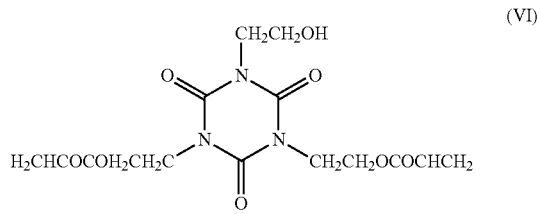

(VI)

Examples of commercially available compounds represented by the above Formula (I) include NK Oligo UA-21 (trade name, Shin-Nakamura Chemical Co., Ltd., in Formula (I), all of $R^1$ are compounds represented by Formula (IV)), M-315 (trade name, To a Gosei Co., Ltd., in Formula (I), all of $R^1$ are compounds represented by Formula (II)), and M-215 (trade name, To a Gosei Co., Ltd., in Formula (I), two $R^1$ are compounds represented by Formula (II) and one $R^1$ is a compound represented by Formula (III)).

The content of the (B1) photopolymerizable compound having at least one unsaturated group and an isocyanuric ring structure in a molecule is preferably 1 part by mass to 40 parts by mass, more preferably 3 parts by mass to 30 parts by mass, and even more preferably 6 parts by mass to 25 parts by mass with respect to 100 parts by mass of the total amount of the components (A) and (B) from the viewpoint of adhesion and film formability.

Component (B2): Compound which is Obtained by Reacting α,β-Unsaturated Carboxylic Acid with Polyhydric Alcohol and/or Glycidyl Group-Containing Compound Examples of the component (B2) include polyalkylene glycol di(meth)acrylates such as polyethylene glycol di(meth)acrylate (having 2 to 14 ethylene groups) and polypropylene glycol di(meth)acrylate (having 2 to 14 propylene groups); trimethylolpropane(meth)acrylate compounds such as trimethylolpropane di(meth)acrylate, trimethylolpropane tri(meth)acrylate, trimethylolpropane ethoxy tri(meth)acrylate, and trimethylolpropane propoxy tri(meth)acrylate; tetramethylol methane(meth)acrylate compounds such as tetramethylol methane tri(meth)acrylate and tetramethylol methane tetra(meth)acrylate; dipentaerythritol(meth)acrylate compounds such as dipentaerythritol penta(meth)acrylate and dipentaerythritol hexa(meth)acrylate; bisphenol A-type di(meth)acrylate compounds such as bisphenol A dioxyethylene di(meth)acrylate, bisphenol A trioxyethylene di(meth)acrylate, and bisphenol A decaoxyethylene di(meth)acrylate; trimethylolpropane triglycidyl ether triacrylate; and bisphenol A diglycidyl ether acrylate.

Among them, a bisphenol A-type di(meth)acrylate compound is preferably included as the component (B2) in consideration of excellent adhesion.

Examples of the bisphenol A-type di(meth)acrylate compound include a compound represented by the following Formula (VII).

[Chemical Formula 7]

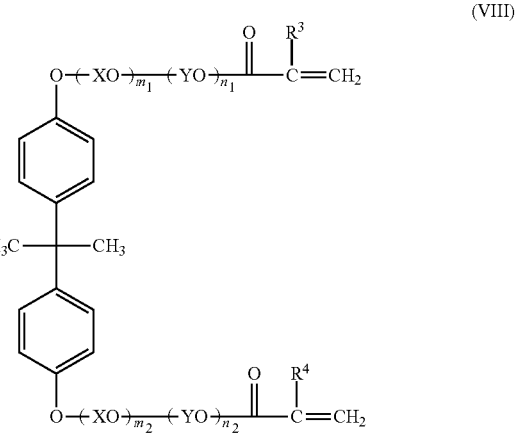

(VIII)

In the above Formula (VII), each of $R^3$ and $R^4$ independently represents a hydrogen atom or a methyl group. Each of XO and YO independently represents an oxyethylene group or an oxypropylene group, and these are different from each other. Each of $(XO)m_1$, $(XO)m_2$, $(YO)n_1$, and $(YO)n_2$ independently represents a (poly)oxyethylene chain or a (poly)oxypropylene chain. Each of $m_1$, $m_2$, $n_1$, and $n_2$ independently represents an integer of 0 to 40. When XO is an oxyethylene group and YO is an oxypropylene group, $m_1+m_2$ is 1 to 40, and $n_1+n_2$ is 0 to 20, and when XO is an oxypropylene group and YO is an oxyethylene group, $m_1+m_2$ is 0 to 20, and $n_1+n_2$ is 1 to 40.

Among compounds represented by the above Formula (VII), 2,2-bis(4-(methacryloxypentaethoxy)phenyl)propane is commercially available as BPE-500 (manufactured by Shin-Nakamura Chemical Co., Ltd., trade name) or FA-321M (manufactured by Hitachi Chemical Co., Ltd., trade name). 2,2-bis(4-(methacryloxypentadecaethoxy)phenyl)propane is commercially available as BPE-1300 (manufactured by Shin-Nakamura Chemical Co., Ltd., trade name). These are used alone, or in arbitrary combination of two or more kinds.

The bisphenol A-type (meth)acrylate compound is preferably used in combination with the trimethylolpropane (meth)acrylate compound.

The content of the component (B2) in the photosensitive resin composition is preferably 1 part by mass to 20 parts by mass, and more preferably 5 parts by mass to 15 parts by mass with respect to 100 parts by mass of the total amount of the components (A) and (B) in consideration of excellent film formability.

Component (B3): Compound Having One Ethylenic Unsaturated Bond in Molecule

Examples of the compound having one ethylenic unsaturated bond in a molecule include nonylphenoxy polyethyleneoxy acrylate, a phthalic acid-based compound, and (meth)acrylic acid alkyl ester.

Among them, nonylphenoxy polyethyleneoxy acrylate or a phthalic acid-based compound is preferably included from the viewpoint of improving resolution, adhesion, a resist shape, and detachment characteristics after curing in a balanced manner.

The component (B3) is not particularly limited, and a compound represented by the following Formula (IX) is preferably included from the viewpoint of excellent resolution.

[Chemical Formula 8]

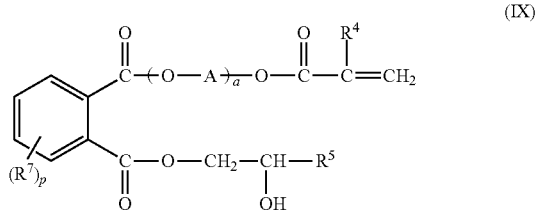

(IX)

[In Formula (IX), $R^5$ represents a hydrogen atom or a methyl group, $R^6$ represents any of a hydrogen atom, a methyl group, and a halogenated methyl group, $R^7$ represents any of an alkyl group having 1 to 6 carbon atoms, a halogen atom, and a hydroxyl group, and p represents an integer of 0 to 4. When p is 2 or greater, a plurality of $R^7$ may be the same or different from each other. —(O-A)- represents an oxyethylene group and/or an oxypropylene group, and a total number a of repetition of —(O-A)- represents an integer of 1 to 4.]

Examples of the compound represented by the above Formula (IX) include γ-chloro-β-hydroxypropyl-β'-(meth)acryloyloxyethyl-o-phthalate, β-hydroxyethyl-β'-(meth)acryloyloxyethyl-o-phthalate, and β-hydroxypropyl-β'-(meth)acryloyloxyethyl-o-phthalate, and among them, γ-chloro-β-hydroxypropyl-β'-(meth)acryloyloxyethyl-o-phthalate is preferable. γ-chloro-β-hydroxypropyl-β'-methacryloyloxyethyl-o-phthalate is commercially available as FA-MECH (manufactured by Hitachi Chemical Co., Ltd., trade name).

The content of the component (B3) in the photosensitive resin composition is preferably 1 part by mass to 15 parts by mass, and more preferably 5 parts by mass to 15 parts by mass with respect to 100 parts by mass of the total amount of the components (A) and (B) in consideration of excellent film formability.

The above-described components (B3) can be used alone, or in combination of two or more kinds. Among them, nonylphenoxy polyethyleneoxy acrylate and a phthalic acid-based compound are preferably used in combination.

Component (C): Photopolymerization Initiator Next, the photopolymerization initiator which is the component (C) will be described.

The photopolymerization initiator which is the component (C) is not particularly limited. Examples thereof include aromatic ketones such as benzophenone, 2-benzyl-2-dimethylamino-1-(4-morpholinophenyl)-butanone-1, and 2-methyl-1-[4-(methylthio)phenyl]-2-morpholino-propanone-1; quinones such as alkylanthraquinone; benzoin ether compounds such as benzoin alkyl ether; benzoin compounds such as benzoin and alkylbenzoin; benzyl derivatives such as benzyl dimethyl ketal; 2,4,5-triaryl imidazole dimers such as 2-(o-chlorophenyl)-4,5-diphenylimidazole dimer and 2-(o-fluorophenyl)-4,5-diphenylimidazole dimer; and acridine derivatives such as 9-phenylacridine and 1,7-(9,9'-acridinyl)heptane. These can be used alone, or in combination of two or more kinds.

The component (C) preferably contains a 2,4,5-triaryl imidazole dimer, and more preferably contains a 2-(o-chlorophenyl)-4,5-diphenylimidazole dimer from the viewpoint of improving sensitivity upon formation of a resist pattern and adhesion of the formed resist pattern. The structure of the 2,4,5-triaryl imidazole dimer may be symmetric or asymmetric.

Component (D): Inorganic Black Pigment

Examples of the inorganic black pigment which is the component (D) include black titanium oxide, carbon black, and cobalt black, and black titanium oxide is preferably used from the viewpoint of patterning properties. The particle size of the inorganic black pigment is preferably 1 μm to 10 μm, and more preferably 10 nm to 1 μm in consideration of suppressing aggregation. Inorganic black pigments having a particle size of 1 nm or less are not easily industrially available, and patterning properties may be affected when the particle size is 10 μm or greater.

Component (E): Surfactant

Examples of the surfactant which is the component (E) include surfactants represented by imidazoline, an unsaturated polycarboxylic acid polymer, alkylammonium salt of polycarboxylic acid, a polysiloxane copolymer, and the like. Examples of commercial products thereof include Homogenol L-100 and Homogenol L-18 (manufactured by Kao Corporation, trade names), and Disperbyk-116 and Disperbyk-108 (manufactured by BYK Japan KK, trade names).

An imidazoline-based surfactant is preferably used from the standpoint of dispersion stability of the (D) inorganic black pigment in the photosensitive resin composition solution and coating appearance upon formation of a photosensitive element.

Examples of the imidazoline-based surfactant include imidazoline derivatives in which the carbon atom at the second position of imidazoline is substituted by a linear saturated or unsaturated hydrocarbon group having 6 to 20 carbon atoms, and the nitrogen atom at the third position is substituted by a hydroxyethyl group. Among them, a compound which is represented by the following Formula (VIII) is preferably used, and Homogenol L-95 (manufactured by Kao Corporation, trade name) is commercially available.

[Chemical Formula 9]

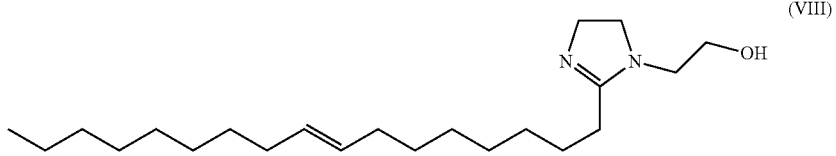

(VIII)

Component (F): Mercapto Group-Containing Compound

The (F) mercapto group-containing compound functions as a hydrogen donor of the (C) photopolymerization initiator. The mercapto group-containing compound which is the component (F) can be used with no particular limits without impairing the effect of the invention, as long as it has a mercapto group. In consideration of excellent resin transparency after exposure, a mercapto group-containing hydrogen donor compound including an aromatic ring is preferably included, and a mercapto group-containing hydrogen donor compound including a heterocyclic ring is preferably included. Among them, at least one kind selected from mercaptobenzoxazole, mercaptobenzimidazole, mercaptobenzotriazole, mercaptobenzothiazole, dimercaptothiadiazole, and mercaptodimethylaminopyridine is more preferably included, and at least one kind selected from mercaptobenzimidazole and mercaptobenzoxazole is even more preferably included, in consideration of improvements in characteristics such as sensitivity, resolution, and adhesion by combination with a photoinitiator and industrial availability.

The content of the component (A) in the photosensitive resin composition is preferably 40 parts by mass to 80 parts by mass, and more preferably 45 parts by mass to 70 parts by mass with respect to 100 parts by mass of the total amount of the components (A) and (B) from the viewpoint of coating properties of the photosensitive resin composition and a mechanical strength of the photocured product.

The content of the component (B) in the photosensitive resin composition is preferably 20 parts by mass to 60 parts by mass, and more preferably 30 parts by mass to 55 parts by mass with respect to 100 parts by mass of the total amount of the components (A) and (B) from the viewpoint of resolution, adhesion, and film formability.

The content of the (C) photopolymerization initiator in the photosensitive resin composition is preferably 0.1 parts by mass to 20 parts by mass, and more preferably 0.2 parts by mass to 10 parts by mass with respect to 100 parts by mass of the total amount of the components (A) and (B) from the viewpoint of sensitivity, adhesion, and curability of the bottom portion of the photocured product. The content of hexaryl biimidazole in the component (C) is preferably 10 mass % to 90 mass %, and more preferably 20 mass % to 80 mass % from the viewpoint of adhesion and suppression of developing sludge during developing.

The content of the (D) inorganic black pigment in the photosensitive resin composition is preferably 0.1 parts by mass to 10 parts by mass, and more preferably 0.2 parts by mass to 5 parts by mass with respect to 100 parts by mass of the total amount of the components (A) and (B) from the viewpoint of light shieldability of the photosensitive resin composition, dispersion stability, and coating appearance upon formation of a photosensitive element.

The content of the (E) surfactant in the photosensitive resin composition is preferably 0.01 parts by mass to 5 parts by mass, more preferably 0.05 parts by mass to 3 parts by mass, even more preferably 0.1 parts by mass to 1 part by mass, and particularly preferably 0.1 parts by mass to 0.9 parts by mass with respect to 100 parts by mass of the total amount of the components (A) and (B) from the viewpoint of light shieldability of the photosensitive resin composition, dispersion stability, coating appearance upon formation of a photosensitive element, and film handleability.

If necessary, the resin composition containing the above-described components can further contain a thermal color development inhibitor, a plasticizer such as p-toluenesulfonamide, a pigment, a filler, an antifoaming agent, a flame retardant, a stabilizer, an adhesion-imparting agent, a leveling agent, a detachment-promoting agent, an antioxidant, a fragrance, an imaging agent, a thermal crosslinking agent, and the like in an amount of approximately 0.01 parts by mass to 20 parts by mass each, with respect to 100 parts by mass of the total amount of the components (A) and (B). However, it is preferable that a component for imparting imaging properties to visually confirm the exposed portion be not contained.

Particularly, the content of a dye such as leuco crystal violet is preferably less than 0.1 parts by mass, more preferably less than 0.01 parts by mass, and even more preferably less than 0.001 parts by mass with respect to 100 parts by mass of the total amount of the components (A) and (B).

The photosensitive resin composition of the invention containing the above-described components can be obtained by, for example, uniformly kneading and mixing the contained components using a roll mill, a bead mill, or the like. If necessary, the photosensitive resin composition of the invention can be used as a solution having a solid content of approximately 30 mass % to 60 mass % by being dissolved in a solvent such as methanol, ethanol, acetone, methyl ethyl ketone, methyl cellosolve, ethyl cellosolve, toluene, N,N-dimethylformamide, or propylene glycol monomethyl ether, or a mixed solvent thereof.

The method for forming (laminating) a photosensitive composition layer on a substrate of an image display device by using the obtained photosensitive resin composition is not particularly limited, and a method including: coating the substrate with a photosensitive resin composition as a liquid resist; and performing drying can be used. In addition, the photosensitive resin composition layer can be coated with a protective film, if necessary. Furthermore, despite being described later in detail, the photosensitive resin composition layer is preferably used in the form of a photosensitive element. The thickness of the applied photosensitive resin composition layer is preferably approximately 1 μm to 100 μm in terms of thickness after drying, despite varying based on the intended use. After applying the photosensitive resin composition as a liquid resist, polymer films such as polyethylene, polypropylene, and the like can be used as the protective film when used to coat.

(Photosensitive Element)

FIG. 1 is a schematic cross-sectional view showing a preferred embodiment of a photosensitive element of the invention. As shown in FIG. 1, a photosensitive element 10 of the invention is provided with a support 1, a photosensitive resin composition layer 2 which is formed of the above-described photosensitive resin composition formed on the support 1, and a protective film 3 which is formed on the photosensitive resin composition layer 2. The protective film 3 is provided if necessary.

As the support 1, a polymer film such as polyethylene terephthalate, polypropylene, polyethylene, or polyester can be preferably used. The thickness of the polymer film is preferably approximately 1 µm to 100 µm, more preferably 5 µm to 50 µm, and even more preferably 10 µm to 30 µm.

The method for forming the photosensitive resin composition layer 2 on the support 1 is not particularly limited, and can be preferably conducted through application and drying of a photosensitive resin composition solution. The thickness of the applied photosensitive resin composition layer 2 is preferably approximately 1 µm to 100 µm in terms of thickness after drying, despite varying based on the intended use. In the case of using according to the present intended use, the thickness of the photosensitive resin composition layer 2 is more preferably 10 µm to 100 µm, even more preferably 20 µm to 90 µm, and particularly preferably 30 µm to 80 µm in terms of thickness after drying.

Coating can be performed by a known method using, for example, a roll coater, a comma coater, a gravure coater, an air knife coater, a die coater, a bar coater, or the like. Drying can be performed for approximately 5 minutes to 30 minutes at 70° C. to 150° C. In addition, the amount of the residual organic solvent in the photosensitive resin composition layer 2 is preferably 2 mass % or less in consideration of preventing diffusion of the organic solvent in the subsequent steps.

The above-described polymer film which is used as the support 1 may be used as the protective film 3 to coat the surface of the photosensitive resin composition layer 2. Regarding the protective film 3, the adhesive strength between the photosensitive resin composition layer 2 and the protective film 3 is preferably smaller than the adhesive strength between the photosensitive resin composition layer 2 and the support 1, and a low-fisheye film is preferable. The photosensitive element 10 may further have an intermediate layer or a protective layer such as a cushion layer, an adhesive layer, a light-absorbing layer, and a gas barrier layer, other than the photosensitive resin composition layer 2, the support 1, and the arbitrary protective film 3.

Generally, the manufactured photosensitive element 10 is stored by being wound around a cylindrical core. In this regard, it is preferably wound so that the support 1 is on the outside. On an end face of the above-described roll-like photosensitive element roll, an end-face separator is preferably installed from the standpoint of protecting the end face, and a dampproof end-face separator is preferably installed from the standpoint of resistance to edge fusion. In addition, packaging by wrapping in a low-moisture-permeable black sheet is preferable as the packaging method. The above-described core is made of a plastic such as a polyethylene resin, a polypropylene resin, a polystyrene resin, a polyvinyl chloride resin, or an ABS resin (acrylonitrile-butadiene-styrene copolymer).

(Method for Forming Partition Wall of Image Display Device and Method for Manufacturing Image Display Device)

Next, a method for forming a partition wall of an image display device and a method for manufacturing an image display device of the invention will be described. The method for forming a partition wall of an image display device has: a lamination step of laminating a photosensitive resin composition layer on a substrate of the image display device by using a photosensitive resin composition or a photosensitive element; an exposure step of irradiating a predetermined portion of the photosensitive resin composition layer with active light rays to photocure the exposed portion; and a developing step of removing a portion other than the exposed portion of the photosensitive resin composition layer to form a photocured pattern.

First, a photosensitive resin composition layer is laminated on a substrate of an image display device by using the above-described photosensitive resin composition of the invention. Examples of the substrate include an insulating substrate such as a glass substrate and a polymer substrate, a semiconductor substrate such as a silicon substrate, a substrate having an electrode such as ITO formed thereon, and a glass substrate having a color filter formed thereon. As the lamination method, the above-described coating method is used and a photosensitive element can also be used.

In the lamination method using the photosensitive element, when a protective film is present on the photosensitive resin composition layer, the lamination on the substrate is performed while the protective film is removed. As the lamination conditions, a lamination method including: pressure-bonding a photosensitive resin composition layer to a substrate at a pressure of approximately 0.1 MPa to 1 MPa (approximately 1 kgf/cm$^2$ to 10 kgf/cm$^2$) while heating the photosensitive resin composition layer at approximately 70° C. to 130° C. is exemplified, and lamination under reduced pressure is also possible. Generally, the substrate has a flat surface shape. However, if necessary, irregularities or an electrode pattern may be formed.

After the lamination of the photosensitive resin composition, the photosensitive resin composition layer is irradiated with active light rays along an image to photocure the exposed portion. As the method for performing irradiation with active light rays along an image, there is a method including: performing irradiation with active light rays along an image using a mask pattern installed on a photosensitive resin composition layer to photocure the photosensitive resin composition layer of the exposed portion. The mask pattern may be a negative type or a positive type, and a commonly-used mask pattern can be used. As a light source of active light rays, a known light source which effectively applies ultraviolet rays or visible light rays, such as a carbon arc lamp, a mercury vapor arc lamp, a high-pressure mercury lamp, or a xenon lamp, is used. A direct drawing exposure method for directly drawing a pattern by a laser without using a mask pattern can also be used as the exposure method.

After the exposure, the photosensitive resin composition layer of the unexposed portion is selectively removed by developing, and thus a photocured pattern is formed on the substrate for an image display device. In the developing step, when a support is present, the support is removed before developing. Developing is performed by removing the unexposed portion through wet developing using a developer such as an alkaline aqueous solution, a water-based developer, or an organic solvent, dry developing, or the like. In the invention, an alkaline aqueous solution is preferably used. Examples of the alkaline aqueous solution include a dilute solution of 0.1 mass % to 5 mass % sodium carbonate, a dilute solution of 0.1 mass % to 5 mass % potassium carbonate, and a dilute solution of 0.1 mass % to 5 mass % sodium hydroxide. The pH of the alkaline aqueous solution is preferably 9 to 11, and the temperature thereof is adjusted to match the developability of the photosensitive resin composition layer. In addition, a surfactant, an antifoaming agent, an organic solvent, and the like may be mixed into the alkaline aqueous solution. Examples of the developing method include a dipping method, a spraying method, brushing, and slapping.

If necessary, as a treatment after the developing, further curing of the formed photocured pattern may be performed by a heating treatment at approximately 60° C. to 250° C.

The method for manufacturing an image display device of the invention has the steps of: filling or coating the inside of the partition wall obtained in the above-described step with a display medium such as particles; and attaching a substrate on the opposite side of the partition wall so as to be opposed to the other substrate. Examples of the substrate include an insulating substrate such as a glass substrate and a polymer substrate, a semiconductor substrate such as a silicon substrate, and a substrate having an electrode such as ITO formed thereon.

Hereinafter, an embodiment of the above-described method for forming a partition wall of an image display device and an embodiment of the method for manufacturing an image display device in the case of using a photosensitive element will be described using the drawings.

Figure 2:
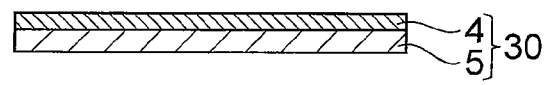
FIG. 2 shows schematic cross-sectional views for illustrating an embodiment of a method for forming a partition wall of an image display device using the photosensitive element of the invention.
Figure 2:
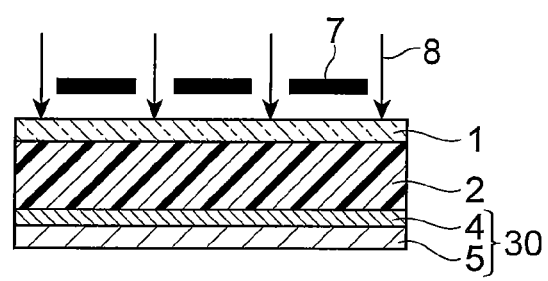
Figure 2:
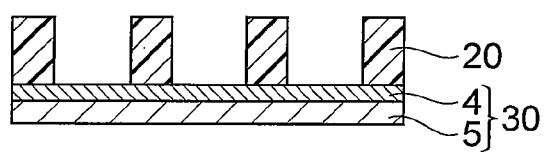
Figure 2:
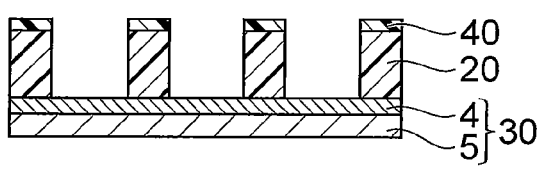
Figure 2:
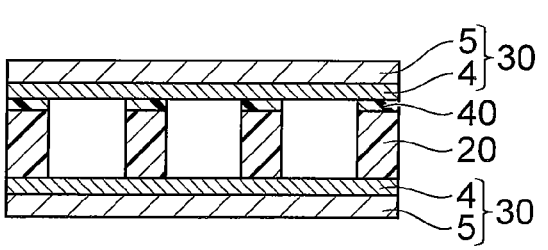

First, an electrode substrate 30 formed of an electrode 4 and a substrate 5 is provided as shown in FIG. 2(*a*), and the photosensitive resin composition layer 2 and the support 1 of the above-described photosensitive element 10 are laminated on this electrode substrate 30 as shown in FIG. 2(*b*) (lamination step).

After the lamination of the photosensitive resin composition layer 2, the photosensitive resin composition layer 2 is irradiated with active light rays 8 along an image using a mask pattern 7 to photocure the exposed portion as shown in FIG. 2(*b*) (exposure step).

After the exposure, the photosensitive resin composition layer 2 of the unexposed portion is selectively removed by developing, and thus a photocured pattern 20 is formed on the substrate (electrode substrate 30) for an image display device as shown in FIG. 2(C) (developing step).

Thereafter, formation of the partition wall of the image display device and manufacturing of the image display device can be completed through a step of filling or coating the inside of the photocured pattern 20 formed in the above-described step with a display medium such as particles and a step of attaching another electrode substrate 30 to the photocured pattern 20 ((d) and (e) in FIG. 2).

The step of attaching another electrode substrate 30 to the photocured pattern 20 can be performed as follows. That is, in the above step, an adhesive 40 is laminated on the photocured pattern 20 as shown in FIG. 2(*d*), and the electrode substrate 30 and the photocured pattern 20 are adhered to each other by the adhesive 40 as shown in FIG. 2(*e*). A transparent electrode substrate is used as the electrode substrate at least on the display surface side of the image display device.

EXAMPLES

Hereinafter, the invention will be described in more detail using examples, but is not limited to these examples as long as there is no departure from the technical thought of the invention.

Examples 1 to 4 and Comparative Examples 1 to 3

A photosensitive resin composition solution was obtained by stirring and mixing materials shown in Table 1. A resin (1) as a component (A) in Table 1 was synthesized in accordance with the following Synthesis Example 1. In Table 1, the unit of the blending amount of each material is in grams (g), and the blending amount of the resin (1) represents a blending amount of the solid content.

Synthesis Example

Synthesis of Binder Polymer 500 g of a blended material of methyl cellosolve and toluene at a mass ratio of 3:2 was put into a flask provided with a stirrer, a reflux condenser, a thermometer, a dropping funnel, and a nitrogen gas introduction pipe, stirred during injection of a nitrogen gas, and heated to 85° C. Meanwhile, a solution (hereinafter, referred to as "solution a") obtained by mixing 150 g of methacrylic acid, 110 g of methacrylic acid methylester, 65 g of acrylic acid ethylester, 50 g of methacrylic acid butylester, and 125 g of styrene, all of which were polymerizable monomers, with 2.5 g of azobisisobutyronitrile was prepared. The solution a was dripped for 4 hours to the blended material of methyl cellosolve and toluene at a mass ratio of 3:2, which had been heated to 85° C. Then, the resulting material was kept warm for 2 hours while being stirred at 85° C. Furthermore, a solution obtained by dissolving 0.5 g of azobisisobutyronitrile in 150 g of a blended material of methyl cellosolve and toluene at a mass ratio of 3:2 was dripped into the flask over 10 minutes. The solution after the dripping was stirred and kept warm at 85° C. for 5 hours, and then cooled and diluted with a mixed solvent of acetone and propylene glycol monomethyl ether at a mass ratio of 3:2 so that the non-volatile content (solid content) was 43 mass %, thereby obtaining a binder polymer (resin (1)). The weight average molecular weight of the obtained binder polymer was 50000. The degree of dispersion was 2.0, and the acid value was 195 mgKOH/g.

The weight average molecular weight of the binder polymer was calculated through measurement by gel permeation chromatography and conversion using a calibration curve of standard polystyrene. The measurement conditions of gel permeation chromatography (GPC) are as follows.

[GPC Measurement Conditions]
Pump: Hitachi L-6000 (manufactured by Hitachi, Ltd.)
Column: Gelpack GL-R440+GL-R450+GL-R400M
Column Specifications: 10.7 mmϕ×300 mm
Eluent: Tetrahydrofuran
Measurement Temperature: Room Temperature (20° C. to 25° C.)
Flow Rate: 2.05 mL/min
Concentration: 120 mg/5 mL
Injection Amount: 200 μL
Pressure: 49 Kgf/cm$^2$
Detector: Hitachi L-3300 RI (manufactured by Hitachi, Ltd.)

TABLE 1

| | | Example 1 | Example 2 | Example 3 | Example 4 | Comparative Example 1 | Comparative Example 2 | Comparative Example 3 |
|---|---|---|---|---|---|---|---|---|
| Component (A) | Resin (1) | 56 | 56 | 56 | 56 | 56 | 56 | 56 |
| Component (B) | M-215 | 10 | 10 | 10 | 10 | 10 | 10 | 10 |
| | HT-9082-95 | 5 | 5 | 5 | 5 | 5 | 5 | 5 |
| | FA-MECH | 5 | 5 | 5 | 5 | 5 | 5 | 5 |
| | FA-314A | 5 | 5 | 5 | 5 | 5 | 5 | 5 |
| | FA-321M | 30 | 30 | 30 | 30 | 30 | 30 | 30 |
| | TMPT-21 | 4 | 4 | 4 | 4 | 4 | 4 | 4 |
| Component (C) | B-CIM | 3.7 | 3.7 | 3.7 | — | 3.7 | 3.7 | 3.7 |
| | EAB | 0.12 | 0.12 | 0.12 | — | 0.12 | 0.12 | 0.12 |
| | N-1717 | — | — | — | 0.3 | — | — | — |
| | I-651 | — | — | — | 3 | — | — | — |
| Component (D) | Black Titanium Oxide | 0.11 | 0.11 | 0.11 | 0.11 | 0.11 | 0.11 | 0.11 |
| Component (E) | Imidazoline-Based Dispersant | 0.25 | 0.25 | 1 | 0.25 | 0.25 | 0.25 | — |
| Component (F) | Mercaptobenzoxazole | 0.12 | — | 0.12 | 0.12 | — | — | 0.12 |
| | Mercaptobenzimidazole | — | 0.12 | — | — | — | — | — |
| Dye | LCV | — | — | — | — | 0.12 | — | — |
| Solvent | Methanol | | | | 4 | | | |
| | Toluene | | | | 12 | | | |
| | Methyl Ethyl Ketone | | | | 2.5 | | | |

The components in the table are as follows.
M-215; bis(acryloxyethyl)hydroxyethyl isocyanurate (manufactured by To a Gosei Co., Ltd., trade name)
HT-9082-95; acrylic resin solution (photopolymerizable compound obtained by reacting a polycarbonate compound having a hydroxyl group at a terminal, organic isocyanate, and 2-hydroxyethyl acrylate: having a weight average molecular weight of 4000, manufactured by Hitachi Chemical Co., Ltd., trade name)
FA-MECH; γ-chloro-2-hydroxypropyl-β'-methacryloyloxyethyl-o-phthalate (manufactured by Osaka Organic Chemical Industry Ltd., trade name)
FA-314A; nonyl phenyl EO-modified monoacrylate (obtained by adding 4 mols of an ethylene oxide (EO) group in one molecule, manufactured by Hitachi Chemical Co., Ltd., trade name)
FA-321M; EO-modified bisphenol A dimethacrylate (obtained by adding 10 mols of an ethylene oxide (EO) group in one molecule, manufactured by Hitachi Chemical Co., Ltd., trade name)
TMPT-21; trimethylolpropane EO-modified triacrylate (obtained by adding 21 mols of an ethylene oxide (EO) group in one molecule, manufactured by Hitachi Chemical Co., Ltd., trade name)
B-CIM; 2-(2-chlorophenyl)-1-[2-(2-chlorophenyl)-4,5-diphenyl-1,3-diazole-2-yl]-4,5-diphenylimidazole (manufactured by Hodogaya Chemical Co., Ltd., trade name)
EAB; N,N'-tetraethyl-4,4'-diaminobenzophenone (manufactured by Hodogaya Chemical Co., Ltd., trade name)
N-1717; 1,7-bis(9-acridinyl)heptane (manufactured by Adeka Corporation, trade name)
I-651; benzyl dimethyl ketal (manufactured by Ciba Speciality Chemicals, trade name)
Black Titanium Oxide; BT-1HCA (manufactured by Mitsubishi Materials Electronic Chemicals Co., Ltd., trade name)
Imidazoline-Based Dispersant (surfactant); (manufactured by Kao Corporation, trade name: Homogenol L-95)
LCV; leuco crystal violet (manufactured by Yamada Chemical Co., Ltd., trade name)

A polyethylene terephthalate film (manufactured by Teijin DuPont Films Japan Limited, trade name: HTR-02) having a thickness of 16 μm was uniformly coated with the photosensitive resin composition solution obtained in Table 1, dried for 10 minutes by a hot-air convection dryer at 90° C., and then protected with a polyethylene protective film (tensile strength in film longitudinal direction: 16 MPa, tensile strength in film width direction: 12 MPa, trade name: NF-15, manufactured by Tamapoly Co., Ltd.), thereby obtaining a photosensitive element. The thickness of the photosensitive resin composition layer after the drying was 40 μm. The obtained photosensitive element was evaluated in terms of coating appearance by visual and microscopic observation. As a result, the coating appearance was superior in any photosensitive element.

Meanwhile, a glass substrate ($SiO_2$ sputtering; length: 370 mm, width: 480 mm, thickness: 0.7 mm, manufactured by Sanritsu Chemicals Co., Ltd., trade name: SP-$SiO_2$) was heated at 80° C., and the above-described photosensitive element was laminated on a glass surface ($SiO_2$-sputtered surface) through a laminating roll heated at 110° C. with detachment of the polyethylene protective film, so that the photosensitive resin composition layer was brought into contact with the glass surface. The obtained laminate has a configuration of the glass substrate, the photosensitive resin composition layer, and the polyethylene terephthalate film from the bottom. The obtained laminate was evaluated in terms of sensitivity, adhesion, resolution, and fading properties.

<Evaluation of Sensitivity>

Using a scattered light exposure machine (manufactured by ORC Manufacturing Co., Ltd.) HMW-201GX having a high-pressure mercury lamp, a phototool having a 41-step tablet was brought into close contact with the polyethylene terephthalate film of the laminate to perform exposure. After the exposure, the polyethylene terephthalate film was detached followed by spraying for 30 seconds with a 1.0 mass % aqueous sodium carbonate solution at 30° C. to remove the unexposed portion. The energy amount in which the number of steps of the 41-step tablet remaining after developing was 26.0 was defined as sensitivity (mJ/cm$^2$). A smaller numerical value of the energy amount indicates higher sensitivity. The evaluation results are shown in Table 2.

<Evaluation of Adhesion>

Using a scattered light exposure machine (manufactured by ORC Manufacturing Co., Ltd.) HMW-201GX having a high-pressure mercury lamp, a phototool as a negative for adhesion evaluation having a wiring pattern with a line width/space width ratio of 30/400 to 200/400 (unit: μm, increasing by 5 μm each in line width, constant in space width), and a phototool having a 41-step tablet were brought into close contact with the polyethylene terephthalate film of the laminate to perform exposure with an energy amount in which the number of steps of the 41-step tablet remaining after developing was 26.0. After the exposure, the polyethylene terephthalate film was detached followed by spraying for 30 seconds with a 1.0 mass % aqueous sodium carbonate solution at 30° C. to remove the unexposed portion to thereby evaluate adhesion. The adhesion was expressed by a width (μm) of the thinnest line which was not detached by the developer but remained. As a numerical value thereof is reduced, even a thin line is not detached from, but brought into close contact with the glass substrate. Thus, a smaller numerical indicates higher adhesion. The evaluation results are shown in Table 2.

<Evaluation of Resolution>

A phototool having a 41-step tablet and a phototool as a negative for resolution evaluation having a wiring pattern with a line width/space width ratio of 30/30 to 200/200 (unit: μm) were brought into close contact with the polyethylene terephthalate film of the laminate to perform exposure using a scattered light exposure machine (manufactured by ORC Manufacturing Co., Ltd.) HMW-201GX having a high-pressure mercury lamp with an energy amount in which the number of steps of the 41-step tablet remaining after developing was 26.0. After the exposure, the polyethylene terephthalate film was detached followed by spraying for 30 seconds with a 1 mass % aqueous sodium carbonate solution at 30° C. to remove the unexposed portion to thereby evaluate resolution. The resolution was expressed by the smallest space width (μm) that allowed clean removal of the unexposed portion by the developing treatment. A smaller numerical value thereof indicates more superior resolution. The evaluation results are shown in Table 2.

<Evaluation of Light Resistance>

Exposure was performed on the laminate using a scattered light exposure machine (manufactured by ORC Manufacturing Co., Ltd.) HMW-201GX having a high-pressure mercury lamp with an energy amount in which the number of steps of the 41-step tablet remaining after developing was 26.0. After the exposure, the polyethylene terephthalate film was detached followed by spraying for 30 seconds with a 1.0 mass % aqueous sodium carbonate solution at 30° C. and leaving for 1 hour in a compartment dryer (manufactured by Mitsubishi Electric Corporation, model number: NV50-CA) heated at 160° C. The laminate after the drying was used as a sample, and its optical density (OD) value was measured using a transmission densitometer (manufactured by Ihara Corporation) Ihac-T5. It is desirable that the OD value be about 0.2 in order to tighten the image on the display. Next, the sample was irradiated with ultraviolet rays for 5 days using a light resistance tester (manufactured by Toyo Seiki Seisaku-sho, Ltd., model number: Suntest XLS+), and an OD value was measured using a transmission densitometer (manufactured by Ihara Corporation) Ihac-T5 to calculate a ratio of fading. The ratio of fading was calculated by a ratio of the OD value after the ultraviolet irradiation to the OD value before the ultraviolet irradiation, as shown in the following Expression (X). The OD value before the ultraviolet irradiation (initial OD values) and the ratio of fading after the ultraviolet irradiation are shown in Table 2.

[Formula 1]

$$\text{Fading Ratio} = \text{OD Value after Ultraviolet Irradiation} / \text{OD Value before Ultraviolet Irradiation} \quad (X)$$

In addition, evaluation of fading properties by heat was performed based on the ratio of fading after the ultraviolet irradiation. The evaluation results are shown in Table 2. With respect to the ratio of fading after the ultraviolet irradiation, a closer numerical value thereof to 1 indicates less fading properties (fading is difficult to occur). The evaluation was performed with little fading properties represented by A (the ratio of fading was greater than 0.7 and equal to or less than 1), slight fading represented by B (the ratio of fading was greater than 0.2 and equal to or less than 0.7), and large fading properties represented by C (the ratio of fading was 0.2 or less).

TABLE 2

|  | Example 1 | Example 2 | Example 3 | Example 4 | Comparative Example 1 | Comparative Example 2 | Comparative Example 3 |
| --- | --- | --- | --- | --- | --- | --- | --- |
| Sensitivity (ST = 26/41) (mJ/cm²) | 281 | 251 | 298 | 140 | 296 | No Pattern Formed | 305 |
| Adhesion (μm) | 50 | 40 | 50 | 70 | 45 |  | 40 |
| Resolution (μm) | 40 | 45 | 45 | 110 | 50 |  | 45 |
| OD Value Before Ultraviolet Irradiation | 0.2 | 0.2 | 0.2 | 0.2 | 0.2 |  | 0.1 |
| Ratio of Fading After Ultraviolet Irradiation | 1 | 1 | 1 | 1 | 0.2 |  | 1 |
| Fading Properties | A | A | A | A | C |  | A |

Table 2 obviously shows that Examples 1 to 4 have superior sensitivity, adhesion, and resolution, and have excellent light resistance since fading from ultraviolet rays occurs hardly.

INDUSTRIAL APPLICABILITY

As described above, according to the invention, it is possible to provide a photosensitive resin composition which can form an excellently light-resistant partition wall of an image display device and has excellent patterning properties, a photosensitive element using the photosensitive resin composition, a method for forming a partition wall of an image display device, and a method for manufacturing an image display device.

REFERENCE SIGNS LIST

1 . . . support; 2 . . . photosensitive resin composition layer; 3 . . . protective film; 4 . . . electrode; 5 . . . substrate; 10 . . . photosensitive element; 20 . . . cured photosensitive resin composition (photocured pattern); 30 . . . electrode substrate; 40 . . . adhesive.

The invention claimed is:

1. A photosensitive element for forming a partition wall of an image display device, comprising:
    a support film;
    a photosensitive resin composition layer including
        (A) a binder polymer;
        (B) a photopolymerizable compound;
        (C) a photopolymerization initiator;
        (D) an inorganic black pigment;
        (E) a surfactant; and
        (F) a mercapto group-containing compound,
    wherein the (B) photopolymerizable compound contains a photopolymerizable compound having at least one unsaturated group and an isocyanuric ring structure in a molecule, formed on the support film; and
    a protective film formed on the photosensitive resin composition layer,
    wherein the photosensitive resin composition layer has a thickness of 10 μm to 100 μm, and
    wherein a dye content of the photosensitive layer is less than 0.1 parts by mass.

2. The photosensitive element according to claim 1, wherein the photopolymerizable compound having at least one unsaturated group and an isocyanuric ring structure in a molecule further contains at least one hydroxyl group in a molecule.

3. The photosensitive element according to claim 1, wherein the (D) inorganic black pigment includes black titanium oxide.

4. The photosensitive element according to claim 1, wherein the (E) surfactant includes an imidazoline-based surfactant.

5. A method for forming a partition wall of an image display device, the method comprising the steps of:
    laminating a photosensitive resin composition layer according to claim 1 on a first substrate of the image display device;
    irradiating a predetermined portion of the photosensitive resin composition layer with active light rays to photocure the exposed portion; and
    removing a portion other than the exposed portion of the photosensitive resin composition layer to form a photocured pattern.

6. The method for forming a partition wall of an image display device according to claim 5, further comprising the additional step of:
    thermally curing the photocured pattern by heating treatment at 60° C. to 250° C.

7. A method for manufacturing an image display device, the method comprising the steps of:
    filling or coating the inside of the partition wall formed by the method according to claim 5 with a display medium; and
    attaching a second substrate on a side of the partition wall opposed to the first substrate.

8. The photosensitive element according to claim 1, wherein the photopolymerization initiator contains a 2,4,5-triaryl imidazole dimer.

9. The photosensitive element according to claim 1, wherein the mercapto group-containing compound contains at least one of the group consisting of mercaptobenzoxazole, mercaptobenzimidazole, mercaptobenzotriazole, mercaptobenzothiazole, dimercaptothiadiazole, and mercaptiodimethylaminopyridine.

10. A partition wall of an image display device comprising a cured photosensitive resin composition layer according to claim 1.

11. A photosensitive element for forming a partition wall of an image display device, comprising:
    a support film;
    a photosensitive resin composition layer including
        (A) a binder polymer;
        (B) a photopolymerizable compound;
        (C) a photopolymerization initiator;
        (D) an inorganic black pigment;
        (E) a surfactant; and
        (F) a mercapto group-containing compound,
    wherein the (B) photopolymerizable compound contains a photopolymerizable compound having at least one unsaturated group and an isocyanuric ring structure in a molecule, formed on the support film; and
    a protective film formed on the photosensitive resin composition layer,
    wherein the photosensitive resin composition layer has a thickness of 10 μm to 100 μm, and
    wherein the mercapto group-containing compound contains at least one of the group consisting of mercaptobenzoxazole, mercaptobenzimidazole, mercaptobenzotriazole, mercaptobenzothiazole, dimercaptothiadiazole, and mercaptiodimethylaminopyridine.

12. The photosensitive element according to claim 11, wherein the photopolymerizable compound having at least one unsaturated group and an isocyanuric ring structure in a molecule further contains at least one hydroxyl group in a molecule.

13. The photosensitive element according to claim 11, wherein the (D) inorganic black pigment includes black titanium oxide.

14. The photosensitive element according to claim 11, wherein the (E) surfactant includes an imidazoline-based surfactant.

15. A method for forming a partition wall of an image display device, the method comprising the steps of:
    laminating a photosensitive resin composition layer according to claim 11 on a first substrate of the image display device;
    irradiating a predetermined portion of the photosensitive resin composition layer with active light rays to photocure the exposed portion; and removing a portion other than the exposed portion of the photosensitive resin composition layer to form a photocured pattern.

16. The method for forming a partition wall of an image display device according to claim 15, further comprising the additional step of:
thermally curing the photocured pattern by heating treatment at 60° C. to 250° C.

17. A method for manufacturing an image display device, the method comprising the steps of:
filling or coating the inside of the partition wall formed by the method according to claim 15 with a display medium; and
attaching a second substrate on a side of the partition wall opposed to the first substrate.

18. The photosensitive element according to claim 11, wherein the photopolymerization initiator contains a 2,4,5-triaryl imidazole dimer.

19. A partition wall of an image display device comprising a cured photosensitive resin composition layer according to claim 11.

* * * * *